(12) United States Patent
Manian et al.

(10) Patent No.: US 11,916,703 B2
(45) Date of Patent: Feb. 27, 2024

(54) ERROR SAMPLER CIRCUIT

(71) Applicant: TEXAS INSTRUMENTS INCORPORATED, Dallas, TX (US)

(72) Inventors: Abishek Manian, San Jose, CA (US); Nithin Sathisan Poduval, Sunnyvale, CA (US); Roland Nii Ofei Ribeiro, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/066,027

(22) Filed: Dec. 14, 2022

(65) Prior Publication Data

US 2023/0122240 A1  Apr. 20, 2023

Related U.S. Application Data

(62) Division of application No. 17/193,067, filed on Mar. 5, 2021, now Pat. No. 11,575,546.

(51) Int. Cl.
*H04L 25/03* (2006.01)
*H03K 3/037* (2006.01)

(52) U.S. Cl.
CPC ..... *H04L 25/03057* (2013.01); *H03K 3/0372* (2013.01)

(58) Field of Classification Search
CPC ......... H04L 25/03057; H04L 25/03885; H04L 25/06; H03K 3/0372
See application file for complete search history.

(56) References Cited

U.S. PATENT DOCUMENTS

| | | | |
|---|---|---|---|
| 2,744,160 A | 5/1956 | Willy | |
| 2,919,417 A | 12/1959 | Adolf | |
| 8,831,064 B1 | 9/2014 | Kaviani | |
| 2008/0187036 A1 | 8/2008 | Park et al. | |
| 2014/0169439 A1 | 6/2014 | Liu | |
| 2014/0307769 A1* | 10/2014 | He | H04L 25/03057 |
| | | | 375/233 |
| 2017/0070373 A1* | 3/2017 | Wei | H04L 25/03878 |
| 2021/0119835 A1* | 4/2021 | Levin | H04L 25/03885 |
| 2021/0266200 A1* | 8/2021 | Yang | H04L 25/4917 |

(Continued)

FOREIGN PATENT DOCUMENTS

CN  103873403 A  6/2014

OTHER PUBLICATIONS

International Search Report, PCT/US2022/019077, dated Jul. 7, 2022, 6 pgs.

(Continued)

*Primary Examiner* — Janice N Tieu
(74) *Attorney, Agent, or Firm* — John R. Pessetto; Frank D. Cimino

(57) ABSTRACT

An error sampler circuit includes a differential input voltage input, a differential reference voltage input, a master latch circuit, and a slave latch circuit. The master latch circuit includes a slicer circuit. The slicer circuit includes a first input, a second input, and a differential output. The first input is coupled to the differential input voltage input. The second input is coupled to the differential reference voltage input. The slave latch includes a differential input coupled to the differential output of the slicer circuit.

16 Claims, 7 Drawing Sheets

(56) References Cited

U.S. PATENT DOCUMENTS

2021/0297295 A1* 9/2021 Fujii ................. G11C 7/1084
2022/0019077 A1 1/2022 Leighton et al.

OTHER PUBLICATIONS

S. Son, H. Yeo, S. Ryu and J. Kim, "A 2x Blind Oversampling FSE Receiver with Combined Adaptive Equalization and Infinite-Range Timing Recovery," 2018 IEEE Asian Solid-State Circuits Conference (A-SSCC), 2018, pp. 201-204, doi: 10.1109/ASSCC.2018.8579286, 4 pgs.

* cited by examiner

ERROR SAMPLER CIRCUIT

CROSS-REFERENCE TO RELATED APPLICATION

This application is a Divisional of application Ser. No. 17/193,067 filed Mar. 5, 2021 which is incorporated by reference herein.

BACKGROUND

Serial communication links, such as serial data interfaces defined by Society of Motion Picture and Television Engineers (SMPTE) standards ST 2081, 2082, and the like, experience high frequency distortion (phase and amplitude) between the transmitter and receiver over a lossy channel. This distortion is manifested at the receiver as inter-symbol interference, such as, a smearing of the transmitted data bits/symbols. Channel equalization is used to counteract inter-symbol interference and other channel induced distortion. Channel equalization is applied using transmission pre-emphasis that pre-distorts a transmit signal and/or as receiver equalization that applies post-compensation for the undesirable frequency effects of the channel

SUMMARY

In one example, an error sampler circuit includes a differential input voltage input, a differential reference voltage input, a master latch circuit, and a slave latch circuit. The master latch circuit includes a slicer circuit. The slicer circuit includes a first input, a second input, and a differential output. The first input is coupled to the differential input voltage input. The second input is coupled to the differential reference voltage input. The slave latch includes a differential input coupled to the differential output of the slicer circuit.

In another example, an error sampler circuit includes a master latch circuit and a slave latch circuit. The master latch circuit includes a slicer circuit and a first latch circuit. The slicer circuit is configured to compare an input voltage to a reference voltage in a first phase of a clock signal. The first latch circuit is coupled to the slicer circuit, and is configured to latch an output of the slicer circuit in a second phase of the clock signal. The slave latch circuit is coupled to the master latch circuit, and includes a comparator and a second latch circuit. The comparator is configured to compare a first output signal and a second output signal of the master latch circuit in the second phase of the clock signal. The second latch circuit is coupled to the comparator, and is configured to latch an output of the comparator in the first phase of the clock signal.

In a further example, an equalizer circuit includes a decision feedback equalizer (DFE) circuit, a sign-sign least mean squares (SS-LMS) adaptation circuit, and an error sampler circuit. The DFE circuit has a first output and a second output. The SS-LMS adaptation circuit has a weight value output coupled to the DFE circuit. The error sampler circuit is coupled to the DFE circuit and the SS-LMS circuit. The error sampler circuit includes a master latch circuit. The master latch circuit includes a slicer circuit. The slicer circuit is configured to generate a first difference signal as a difference of the first output and a first reference signal, and to generate a second difference signal as a difference of the second output and a second reference signal.

BRIEF DESCRIPTION OF THE DRAWINGS

For a detailed description of various examples, reference will now be made to the accompanying drawings in which.

The same reference numbers are used in the drawings to show the same or similar (by function and/or structure) features.

DETAILED DESCRIPTION

In serial communication systems, equalizer settings are automatically updated to compensate for channel loss. Sign-sign least mean squares (SS-LMS) adaptation is one method for updating equalizer settings. SS-LMS uses two samplers: 1) a data sampler that samples data, and 2) an error sampler that subtracts a programmable DC threshold voltage (Vref) from the data (i.e., Vin−Vref) and samples the resultant error signal. Data and error are sampled with the same clock. In some systems, the error sampler includes an unclocked slicer (e.g., an asynchronous comparator used as a slicer to slice Vin compared to a threshold Vref) followed by a ground-referenced comparator. To match the delays of the data and error paths, an unclocked slicer is added in the data path. Addition of the slicer to the data path makes it difficult to meet decision feedback equalizer (DFE) timing requirements for the first DFE tap. In other systems, the slicer is only provided in the error path (such that, a slicer is not included in the data path). This configuration alleviates the DFE issues, but requires precise delay matching in the clock path of the error sampler so that the error and data samplers sample at the same instant. Precise delay matching is difficult because delay varies with process, voltage, temperature, and mismatch. Some systems include a current mode logic (CML) latch with two input differential pairs (one pair for Vin and one pair for Vref). The output currents of the differential pairs are subtracted and the CML is used as a slicing sampler. However, the Vin differential pair must be degenerated to obtain meaningful subtraction which results in low gain/sensitivity.

The error sampler described herein merges slicing and sampling without inclusion of degeneration resistors and, thereby, provides higher gain/sensitivity and lower input capacitance than CML samplers. The described error sampler also eliminates the need for a separate slicer, which saves power and allows for relaxed DFE loop timing. The error sampler uses an $f_T$-doubler-type structure (with one differential pair for Vin+ minus Vref+ and another differential pair for Vin− minus Vref−) to perform Vin minus Vref (Vin−Vref) operation directly in the error sampler, without the need for an additional slicer. No delay matching is needed because the combined slicing and sampling allows the same clock signal to be used for both data and error sampling. Because the error sampler requires the common-mode voltage of Vin and the common mode voltage of Vref to be equal, a common-mode loop is included to keep the common-modes of Vin and Vref equal.

Figure 1:
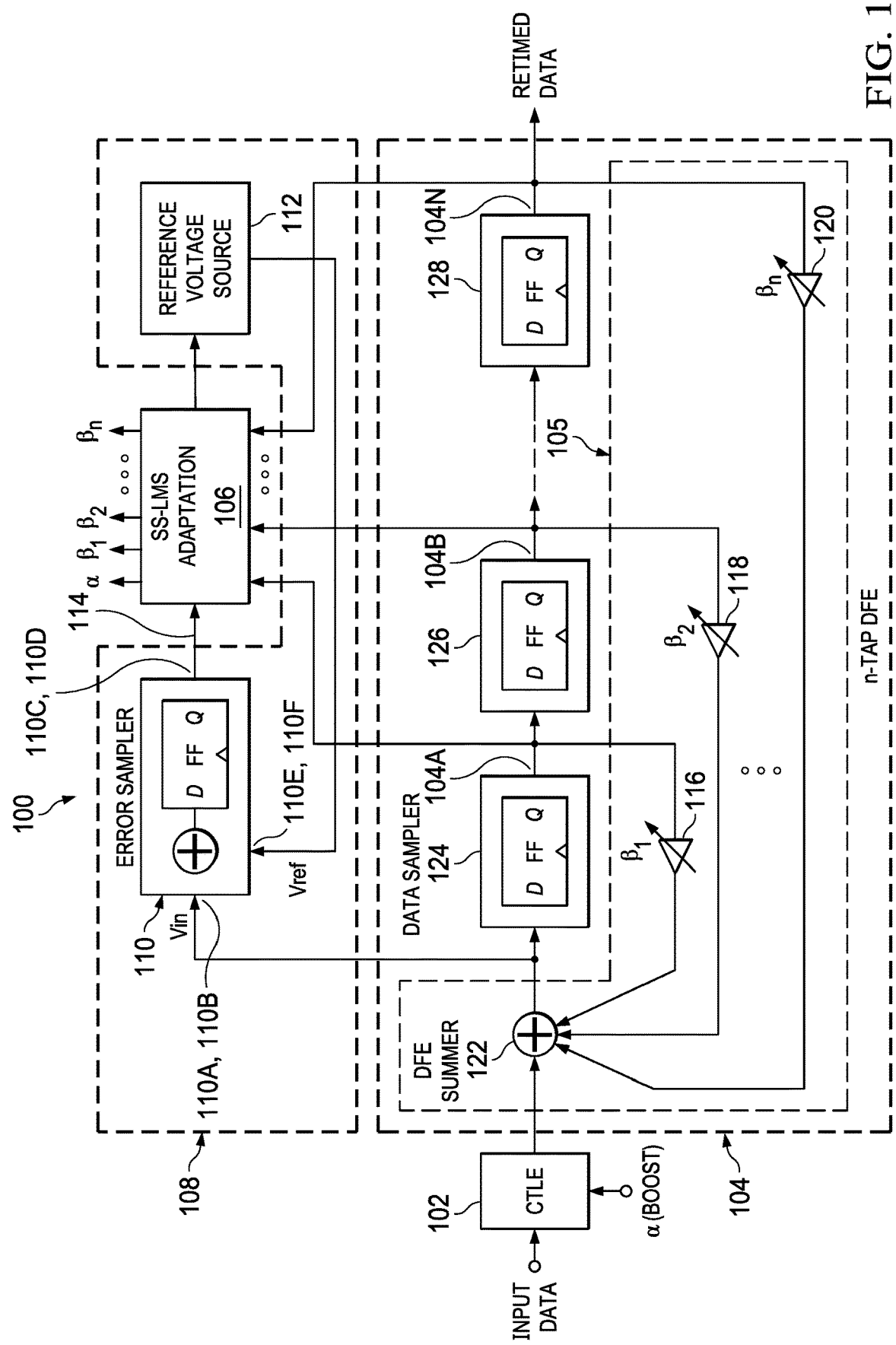
FIG. 1 shows block diagram for an example equalizer circuit that includes an error sampler with an integrated slicer.

Referring to FIG. 1, equalizer circuit 100 of some example embodiments includes an error sampler with an integrated slicer. The equalizer circuit 100 is suitable for use in a wireline signal receiver circuit for receiving serial data signals in a variety of applications (e.g., video data receivers, such as Society of Motion Picture and Television Engineers (SMPTE) compatible receivers, Ethernet receivers, peripheral component interconnect (PCI) express receivers, etc.). The equalizer circuit 100 includes a continuous time linear equalizer (CTLE) circuit 102, a decision feedback equalizer (DFE) circuit 104, an SS-LMS adaptation circuit 106, and an error sampler circuit 108. The CTLE circuit 102 boosts the high frequency content of a received signal (such as "input data" in FIG. 1). The CTLE circuit 102 is coupled to the DFE circuit 104, and output signal of the CTLE circuit 102 is provided to the DFE circuit 104 for further equalization.

The SS-LMS adaptation circuit 106 is coupled to the DFE circuit 104. The DFE circuit 104 includes one or more flip-flops (flip-flops 124, 126, and 128) that form taps, the outputs of which are weighted (in the buffer circuits 116, 118, and 120) and summed with the output signal of the CTLE circuit 102 at the summing node 122 to reduce inter-symbol interference in received signal. The weight values ($\beta_1$, $\beta_2$, $\beta_n$) applied to the tap outputs in the buffer circuits 116, 118, and 120 of the DFE circuit 104, and a boost value (a) applied in the CTLE circuit 102 are provided by the SS-LMS adaptation circuit 106. The SS-LMS adaptation circuit 106 adjusts the weight and boost values to compensate for changes in the channel providing signal to the equalizer circuit 100.

The error sampler circuit 108 is coupled to the DFE circuit 104 and the SS-LMS adaptation circuit 106 and generates an error signal 114 as a difference of an input signal (Vin) produced by the DFE circuit 104 and reference voltage (Vref). The SS-LMS adaptation circuit 106 applies the error signal to generate the weight ($\beta_1$, $\beta_2$, $\beta_n$) and boost ($\alpha$) values respectively applied by the DFE circuit 104 and the CTLE circuit 102. The error sampler circuit 108 includes an error sampler 110 and a reference voltage source 112. The reference voltage source 112 is coupled to the SS-LMS adaptation circuit 106, and generates Vref based on output of the SS-LMS adaptation circuit 106. The reference voltage source 112 is also coupled to the error sampler 110, and provides Vref to the error sampler 110 for comparison to Vin. The error sampler 110 samples Vin and Vref, determines the difference of Vin and Vref, latches the difference, and provides the difference to the SS-LMS adaptation circuit 106 for use in updating the weight values applied in the DFE circuit 104.

Figure 2A:
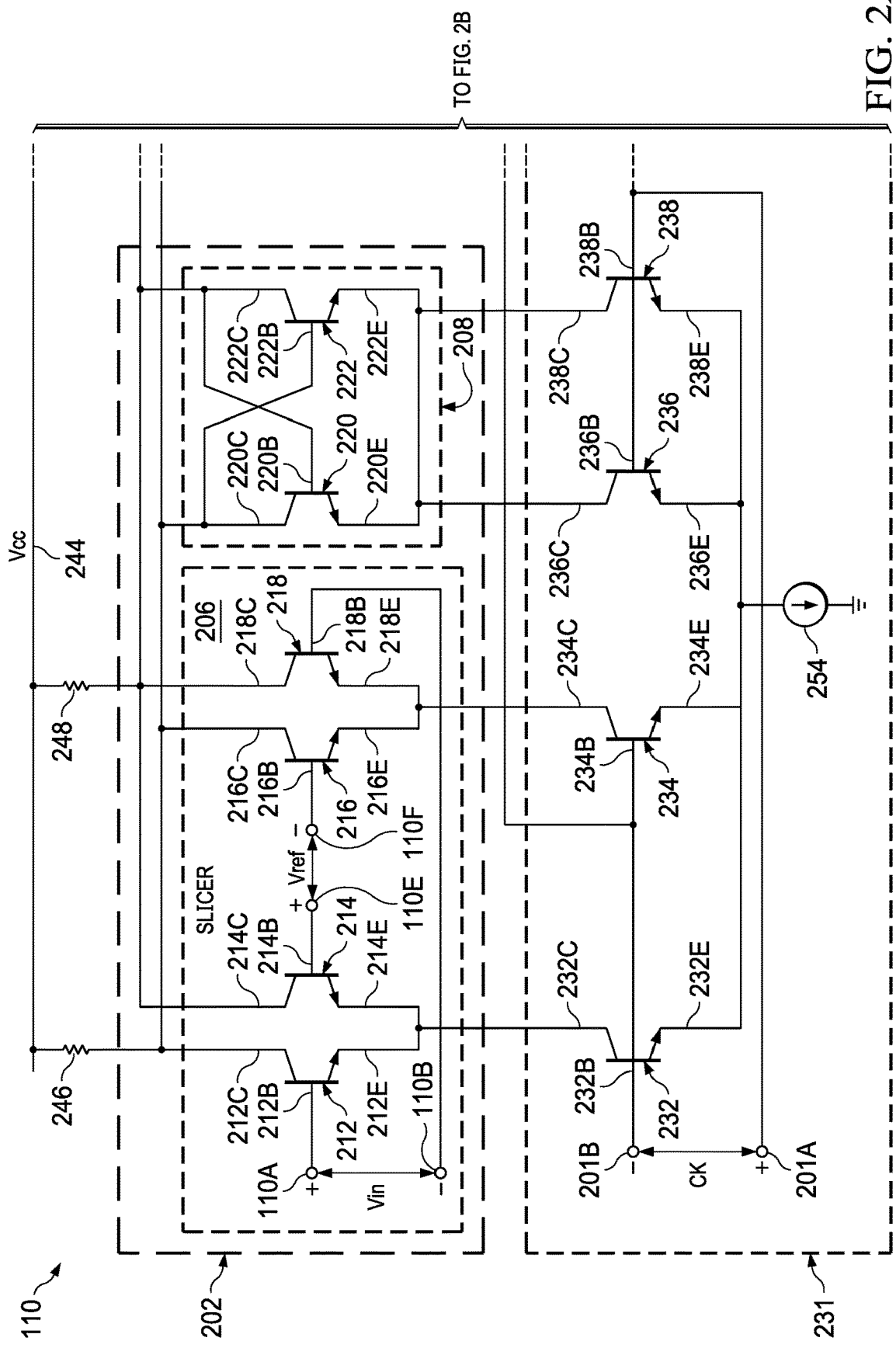
FIGS. 2A and 2B show a schematic level diagram for an example error sampler suitable for use in the equalizer circuit of FIG. 1.
Figure 2B:
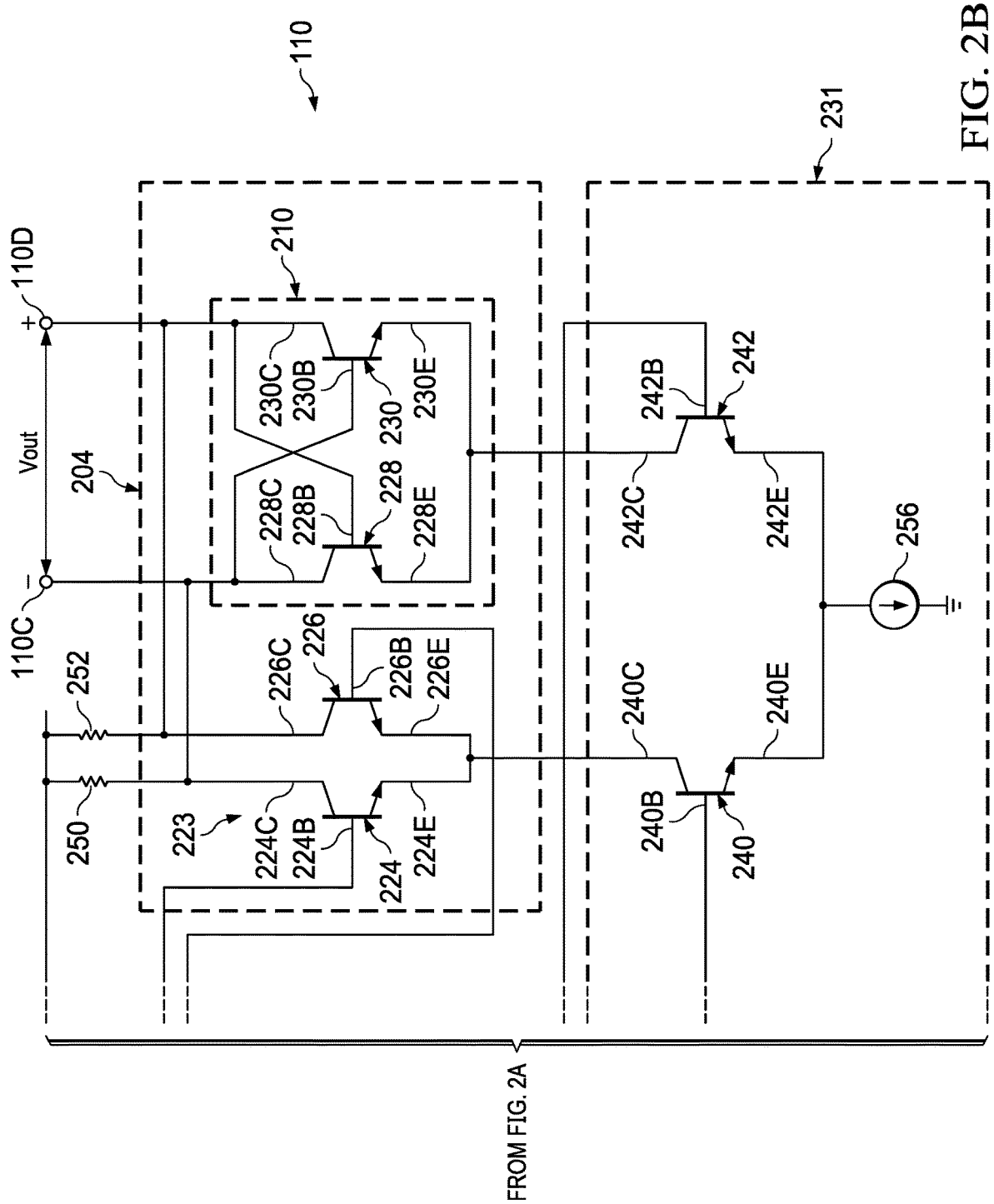

FIGS. 2A and 2B show a schematic level diagram for an example error sampler 110. The error sampler 110 includes a master latch circuit 202 and a slave latch circuit 204. The slave latch circuit 204 is coupled to the master latch circuit 202, latches the output of the master latch circuit 202, and provides (via the output terminals 110C and 110D) the latched output to the SS-LMS adaptation circuit 106. The master latch circuit 202 samples Vin (Vin+ and Vin−) and Vref (Vref+ and Vref−), determines the difference of Vin and Vref, and latches the difference. The master latch circuit 202 includes a slicer circuit 206 and a latch circuit 208. The error sampler 110 includes an input terminal 110A for receiving Vin+, an input terminal 110B for receiving Vin−, an input terminal 110E for receiving Vref+, and an input terminal 110F for receiving Vref−. The slicer circuit 206 that compares Vin to Vref using an $f_T$-doubler-type structure with a first differential pair (a comparator circuit) for Vin+ minus Vref+, and a second differential pair (a comparator circuit) for Vin− minus Vref−. The output currents of the differential pairs are subtracted to produce Vin−Vref.

Slicer circuit 206 includes transistor 212 and transistor 214, that form the first differential pair, and transistor 216 and transistor 218, that form the second differential pair. The first differential pair generates a difference signal as a difference of Vin+ and Vref+. The second differential pair generates a difference signal as a difference of Vin− and Vref−. A base terminal 212B (a control terminal) of the transistor 212 is an input of the slicer circuit 206, and is coupled to the input terminal 110A. A base terminal 218B of the transistor 218 is an input of the slicer circuit 206, and is coupled to the input terminal 110B. A base terminal 214B of the transistor 214 is an input of the slicer circuit 206, and is coupled to the input terminal 110E. A base terminal 216B of the transistor 216 is an input of the slicer circuit 206, and is coupled to the input terminal 110F. An emitter terminal 212E (a current terminal) of the transistor 212 is coupled to an emitter terminal 214E of the transistor 214. An emitter terminal 216E of the transistor 216 is coupled to the emitter terminal 218E of the transistor 218. A collector terminal 212C (a current terminal) of the transistor 212 is coupled to a power supply terminal 244 via a resistor 246. A collector terminal 216C of the transistor 216 is coupled to the collector terminal 212C of the transistor 212 and is a first output of the slicer circuit 206. A collector terminal 218C of the transistor 218 is coupled to the power supply terminal 244 via the resistor 248. The collector terminal 214C of the transistor 214 is coupled to the collector terminal 218C of the transistor 218, and is a second output of the slicer circuit 206.

The latch circuit 208 is coupled to the slicer circuit 206, and latches the outputs of the slicer circuit 206. The latch circuit 208 includes a transistor 220 and a transistor 222. An emitter terminal 220E of the transistor 220 is coupled to an emitter terminal 222E of the transistor 222. A collector terminal 220C of the transistor 220 is coupled to the collector terminal 216C of the transistor 216 and the base terminal 222B of the transistor 222. A collector terminal 222C of the transistor 222 is coupled to the collector terminal 214C of the transistor 214 and the base terminal 220B of the transistor 220.

The slave latch circuit 204 includes a latch circuit 210 and a comparator circuit 223. The comparator circuit 223 compares the output of the master latch circuit 202, and includes a differential pair including the transistor 224 and the transistor 226. The differential pair generates a difference signal as a difference of the outputs of the slicer circuit 206. An emitter terminal 224E of the transistor 224 is coupled to an emitter terminal 226E of the transistor 226. A base terminal 224B is an input of the slave latch circuit 204, and is coupled to the collector terminal 222C of the transistor 222. A collector terminal 224C of the transistor 224 is coupled to the power supply terminal 244 via the resistor 250, and to the output terminal 110C of the error sampler 110. A base terminal 226B of the transistor 226 is an input of the slave latch circuit 204, and is coupled to the collector terminal 220C of the transistor 220. A collector terminal 226C of the transistor 226 is coupled to the power supply terminal 244 via the resistor 252, and to the output terminal 110D of the error sampler 110.

The latch circuit 210 is coupled to the comparator circuit 223, and latches the outputs of the transistor 224 and the transistor 226. The latch circuit 210 includes a transistor 228 and a transistor 230. An emitter terminal 228E of the transistor 228 is coupled to an emitter terminal 230E of the transistor 230. A collector terminal 228C of the transistor 228 is coupled to the collector terminal 224C of the transistor 224, the base terminal 230B of the transistor 230 and the output terminal 110C. A collector terminal 230C of the transistor 230 is coupled to the base terminal 228B of the transistor 228, the collector terminal 226C of the transistor 226, and the output terminal 110D. The output terminals 110C and 110D of the error sampler 110 are coupled to the SS-LMS adaptation circuit 106.

Clock circuitry 231 controls the timing of operations in the error sampler 110. The clock circuitry 231 includes a transistor 232, a transistor 234, a transistor 236, a transistor 238, a transistor 240, and a transistor 242. The transistor 232 controls the transistor 212 and the transistor 214. The base terminal 232B of the transistor 232 is coupled to a clock input terminal 201B. A collector terminal 232C of the transistor 232 is coupled to the emitter terminal 212E of the transistor 212 and the emitter terminal 214E of the transistor 214. An emitter terminal 232E of the transistor 232 is coupled to ground via a current source 254.

The transistor 234 controls the transistor 216 and the transistor 218. The base terminal 234B of the transistor 234 is coupled to the clock input terminal 201B. A collector terminal 234C of the transistor 234 is coupled to the emitter terminal 216E of the transistor 216 and the emitter terminal 218E of the transistor 218. An emitter terminal 234E of the transistor 234 is coupled to the emitter terminal 232E of the transistor 232.

The transistor 236 and the transistor 238, coupled in parallel, control the transistor 220 and the transistor 222. The base terminal 236B of the transistor 236 is coupled to a clock input terminal 201A. A collector terminal 236C of the transistor 236 is coupled to the emitter terminal 220E of the transistor 220 and the emitter terminal 222E of the transistor 222. An emitter terminal 236E of the transistor 236 is coupled to the emitter terminal 232E of the transistor 232. A base terminal 238B of the transistor 238 is coupled to the base terminal 236B of the transistor 236. A collector terminal 238C of the transistor 238 is coupled to the collector terminal 236C of the transistor 236. An emitter terminal 238E of the transistor 238 is coupled to the emitter terminal 236E of the transistor 236.

The transistor 240 controls the transistor 224 and the transistor 226. The base terminal 240B of the transistor 240 is coupled to the clock input terminal 201A. A collector terminal 240C of the transistor 240 is coupled to the emitter terminal 224E of the transistor 224 and the emitter terminal 226E of the transistor 226. An emitter terminal 240E of the transistor 240 is coupled to ground via a current source 256.

The transistor 242 controls the transistor 228 and the transistor 230. The base terminal 242B of the transistor 242 is coupled to the clock input terminal 201B. A collector terminal 242C of the transistor 242 is coupled to the emitter terminal 228E of the transistor 228 and the emitter terminal 230E of the transistor 230. An emitter terminal 242E of the transistor 242 is coupled to the 240E of the transistor 240.

In the error sampler 110, while in the amplification phase (when the clock signal (CK) is low):

$$V_{out} = A(V_{in}^+ - V_{ref}^+)(V_{in}^+ - V_{ref}^+) + A(V_{in}^+ - V_{ref}^+)(V_{in}^+ - V_{ref}^+), \quad (1)$$

where A(x) is the gain of a differential pair in the slicer circuit 206 as a function of its input differential voltage x. Thus, $A(V_{in}^+ - V_{ref}^+)$ specifies the non-linear gain of one of the differential pairs of the slicer circuit 206 as a function of the input differential voltage, $V_{in}^+ - V_{ref}^+$.

If the common-modes of Vin and Vref are equal to Vcm, and the differential voltages of Vin and Vref are Vid and Vrd respectively, then:

$$V_{in}^+ = V_{cm} + \frac{V_{id}}{2}, \quad (2)$$

$$V_{in}^- = V_{cm} - \frac{V_{id}}{2}, \quad (3)$$

$$V_{ref}^+ = V_{cm} + \frac{V_{rd}}{2}, \text{ and} \quad (4)$$

$$V_{ref}^- = V_{cm} - \frac{V_{rd}}{2}. \quad (5)$$

Rewriting equation (1) using equations (2)-(5):

$$\begin{aligned} V_{out} &= A\left(\frac{V_{id}}{2} - \frac{V_{rd}}{2}\right)\left(\frac{V_{id}}{2} - \frac{V_{rd}}{2}\right) + A\left(-\frac{V_{rd}}{2} + \frac{V_{id}}{2}\right)\left(-\frac{V_{rd}}{2} + \frac{V_{id}}{2}\right) \\ &= 2A\left(\frac{V_{id}}{2} - \frac{V_{rd}}{2}\right)\left(\frac{V_{id}}{2} - \frac{V_{rd}}{2}\right) \end{aligned} \quad (6)$$

$$V_{out} = A\left[\frac{(V_{in} - V_{ref})}{2}\right](V_{in} - V_{ref}). \quad (7)$$

The error sampler 110 operates as a slicer without any need for degeneration, and provides high gain/sensitivity.

Figure 3:
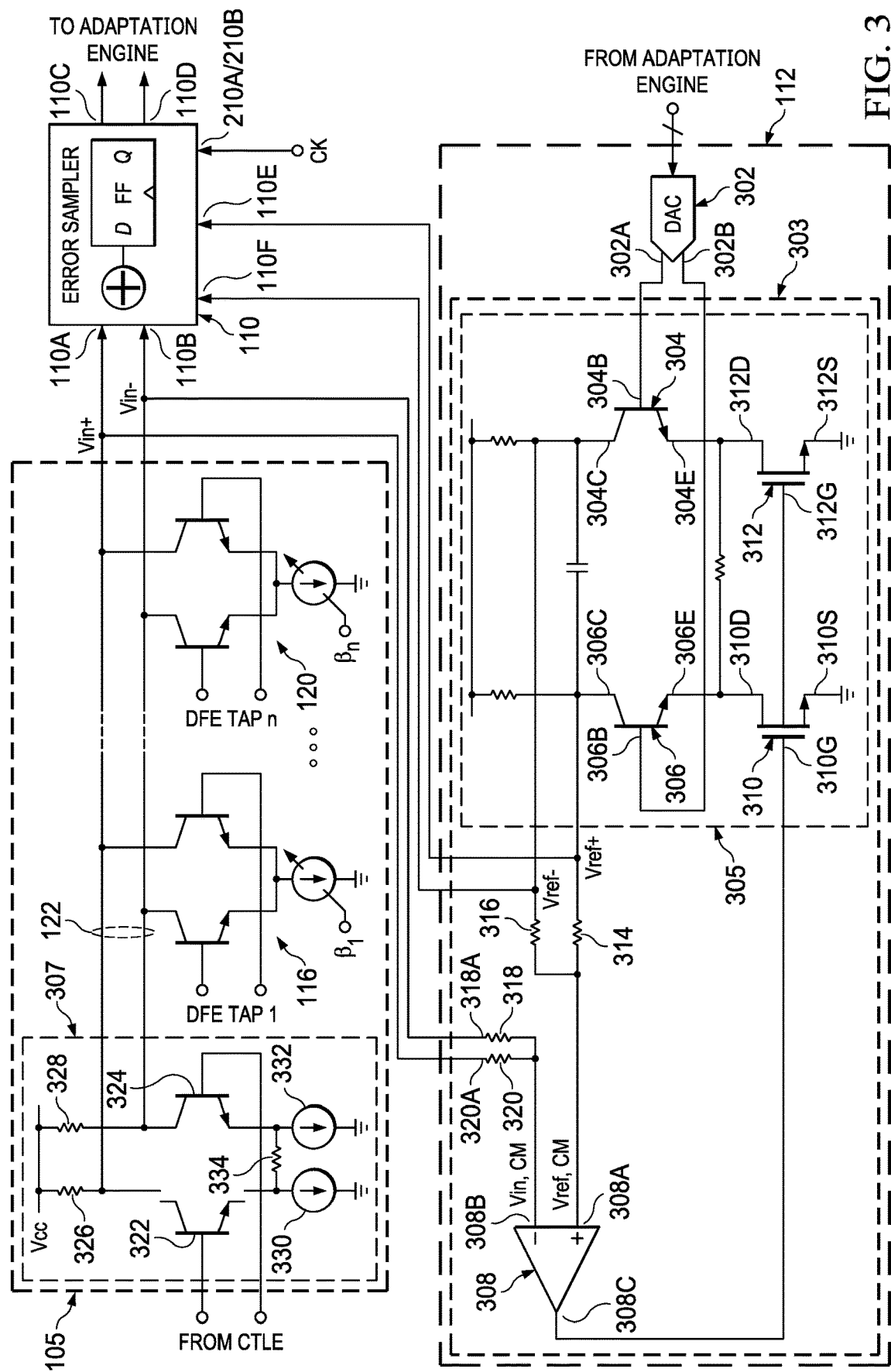
FIG. 3 shows a schematic level diagram for a reference voltage source suitable for use in the equalizer circuit of FIG. 1.

FIG. 3 shows a schematic level diagram for an example reference voltage source 112. In the equalizer circuit 100, the common-mode voltage at the output of the DFE circuit 104 changes with the weight values applied in the DFE circuit 104. For the error sampler 110 to operate as a comparator, the common-mode voltages of Vin and Vref should be equal. The reference voltage source 112 includes a digital-to-analog converter (DAC) 302 and a common-mode feedback loop 303. The DAC 302 receives a multi-bit digital code, representing a desired reference voltage, from the SS-LMS adaptation circuit 106 and converts the code to the reference voltage. Output 302A and output 302B of the DAC 302 are coupled to the common-mode feedback loop 303. The common-mode feedback loop 303 adjusts the common-mode voltage of Vref output by the reference voltage source 112 so that the common-mode voltage of Vref is the same as the common-mode voltage of Vin provided by the DFE circuit 104.

The common-mode feedback loop 303 includes a buffer circuit 305 and an amplifier 308. The amplifier 308 generates an error signal (an error voltage) representing the difference of common-mode voltage of Vin and common-mode voltage of Vref. The amplifier 308 includes an input terminal 308B coupled to the input terminal 110A and the input terminal 110B of the error sampler 110 by the resistors 318 and 320. The resistor 320 couples the input terminal 110A to the input terminal 308B, and the resistor 318 couples the input terminal 110B to the input terminal 308B to provide the common-mode voltage of Vin at the input terminal 308B. A terminal 320A of the resistor 320 is an input of the common-mode feedback loop 303 and is coupled to the input terminal 110A of the error sampler 110. A terminal 318A of the resistor 318 is an input to the common-mode feedback loop 303 and is coupled to the input terminal 110B of the error sampler 110. The amplifier 308 also includes an input terminal 308A coupled to the input terminal 110E and the input terminal 110F of the error sampler 110 by the resistors 314 and 316. The resistor 314 couples the input terminal 110E to the input terminal 308A, and the resistor 316 couples the input terminal 110F to the input terminal 308A to provide the common-mode voltage of Vref at the input terminal 308A. The output terminal 308C of the amplifier 308 is coupled to the buffer circuit 305 to provide the error voltage to the buffer circuit 305.

The buffer circuit 305 is similar to a buffer circuit 307 of the DFE circuitry 105, which is shown for reference in FIG. 3. The DFE circuitry 105 includes buffer circuits 307, 116, and 120 that provide currents to the summing node 122. The buffer circuit 307 receives signal from the CTLE 102 and provides a current representative of the received signal to the summing node 122. The buffers 116 and 120 receive signals from the tap flip-flops of the DFE, and provide scaled currents representative of the received signals to the summing node 122. The buffer circuit 307 is a differential amplifier that includes matched transistors 322 and 324, matched resistors 326 and 328 coupled to the collectors of the transistors 322 and 324, matched current sources 330 and 332 coupled to the emitters of the transistors 322 and 324, and degeneration resistor 334 coupled to the emitters of the transistors 322 and 324. Differential signal received at the bases of the transistors 322 and 324, from the CTLE 102, changes the currents flowing in the transistors 322 and 322, which in-turn changes the current flowing from the buffer circuit 307 to the summing node 122 as a function of the received signal. In the buffers 116 and 120, the currents flowing in the differential pair are a function of the tap output received at the bases of the transistors and the current, of the variable current source coupled to the emitters of the transistors, set by weight value β. Thus, the buffers 116 and 120 vary the current at the summing node 122 for each tap of the DFE 104.

The buffer circuit 305 buffers the reference voltage output by the DAC 302 and adjusts the common-mode voltage of the reference voltage, based on the error voltage output of the amplifier 308, to produce Vref. The voltage gain of the buffer circuit 305 need not be accurate because the SS-LMS adaptation circuit 106 adjusts the digital code provided to the DAC to set a desired value of Vref. The buffer circuit 305 includes a transistor 304, a transistor 306, a transistor 310, and a transistor 312. Operation of the buffer circuit 305 is similar to that of the buffer circuit 307, except that current flow in the transistors 304 and 306 is controlled by the error voltage generated by the amplifier 308 to adjust the common-mode voltage of the reference voltage Vref. A base terminal 304B of the transistor 304 is an input to the common-mode feedback loop 303 and is coupled to the output 302A of the DAC 302. A base terminal 306B of the transistor 306 is an input of the common-mode feedback loop 303 and is coupled to the output 302B of the DAC 302. A collector terminal 304C of the transistor 304 is an output of the common-mode feedback loop 303 (and the reference voltage source 112) and is coupled to the input terminal 110F of the error sampler 110. A collector terminal 306C of the transistor 306 is an output of the common-mode feedback loop 303 (and the reference voltage source 112) and is coupled to the input terminal 110E of the error sampler 110. An emitter terminal 304E of the transistor 304 is coupled to ground via the transistor 312. An emitter terminal 306E of the transistor 306 is coupled to ground via the transistor 310.

A drain terminal 310D (a current terminal) of the transistor 310 is coupled to the emitter terminal 306E of the transistor 306. A source terminal 310S (a current terminal) of the transistor 310 is coupled to ground. A gate terminal 310G (a control terminal) of the transistor 310 is coupled to the output terminal 308C of the amplifier 308. A drain terminal 312D of the transistor 312 is coupled to the emitter terminal 304E of the transistor 304. A source terminal 312S of the transistor 312 is coupled to ground. A gate terminal 312G of the transistor 312 is coupled to the output terminal 308C of the amplifier 308.

Figure 4:
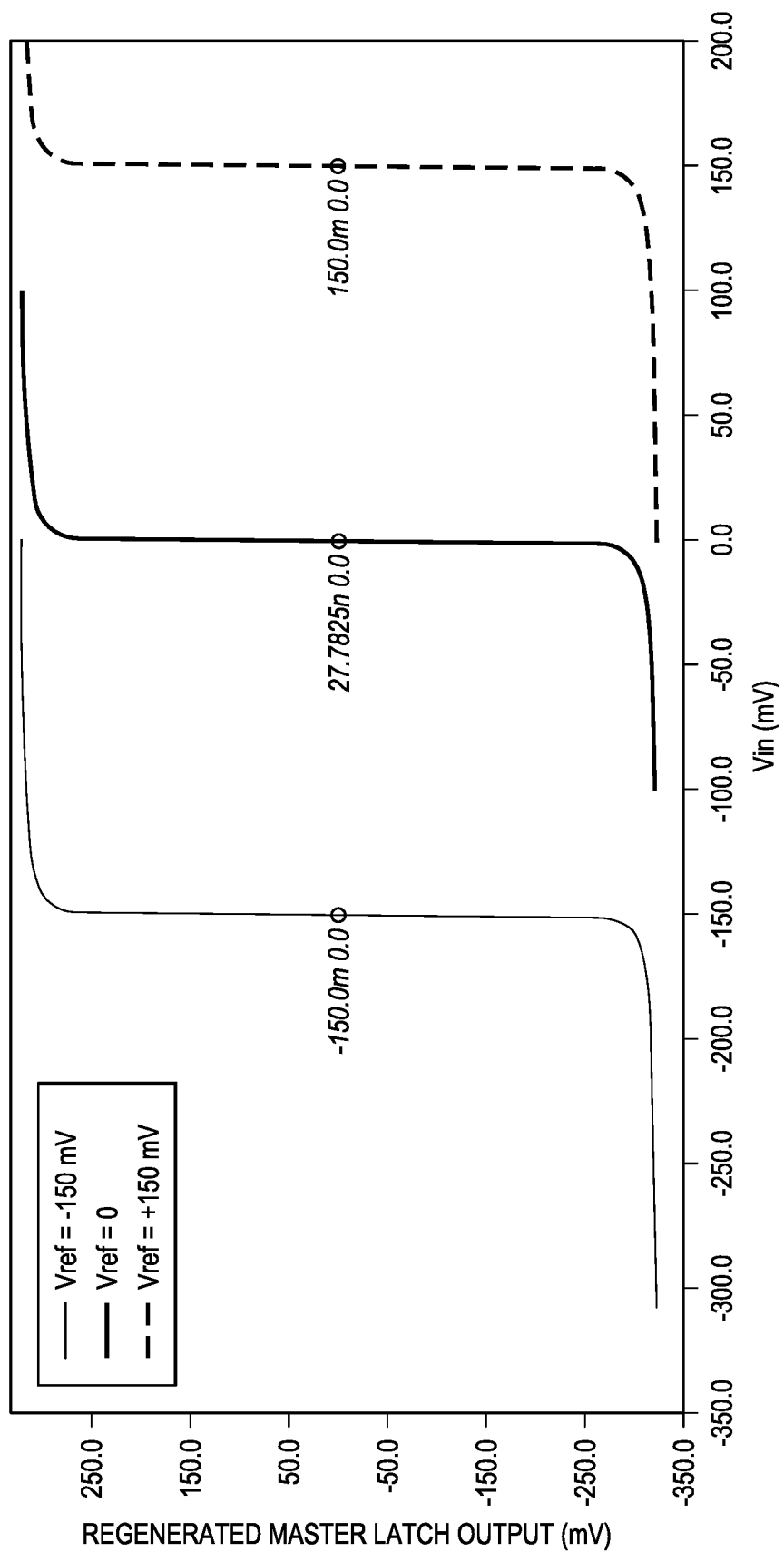
FIG. 4 shows a graph of transfer characteristics of the error sampler of FIGS. 2A and 2B with different reference voltages.

FIG. 4 shows a graph of transfer characteristics of the error sampler 110 using different reference voltages. As shown in FIG. 4, the x-axis represents the voltage in millivolts (mV) of the input signal Vin at the input terminals 110A and 110B of the error sampler 110, and the y-axis represents the voltage, in mV, of the settled output (220C, 222C) of the master latch circuit 202. The waveforms of FIG. 4 show the transfer characteristics of the error sampler circuit 108 for Vref values of −150 millivolts, 0 volts, and 150 millivolts for values of Vin about each Vref value. FIG. 4 shows that the error sampler circuit 108 provides high gain/sensitivity and robust slicing. FIG. 4 shows that as the reference voltage (Vref) changes the gain of the master latch circuit 202 with integrated slicer, at the point where the Vin equals Vref, does not change. That is, the slope of the gain curve (master latch output/Vin) is same at the trip point (Vin=Vref, illustrated as a circle in each gain curve) for different values of Vref (i.e., gain is not dependent on Vref).

Figure 5:
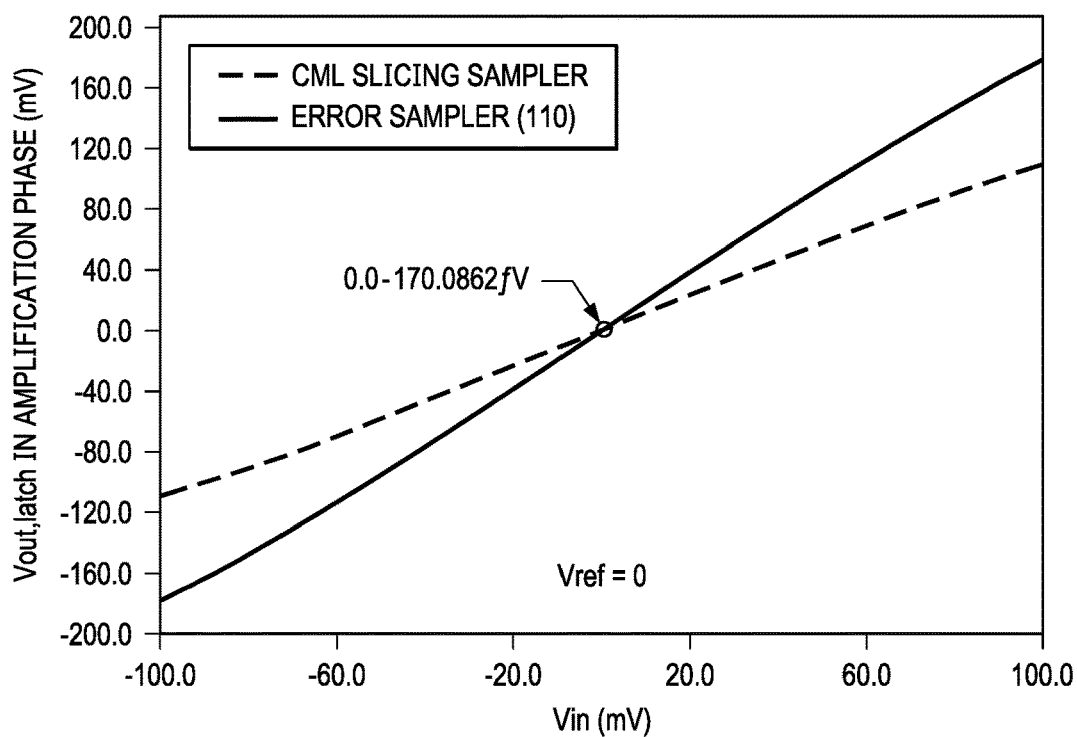
FIGS. 5-7 show graphs comparing the error sampler of FIGS. 2A and 2B with a current mode logic (CML) error sampler.
Figure 6:
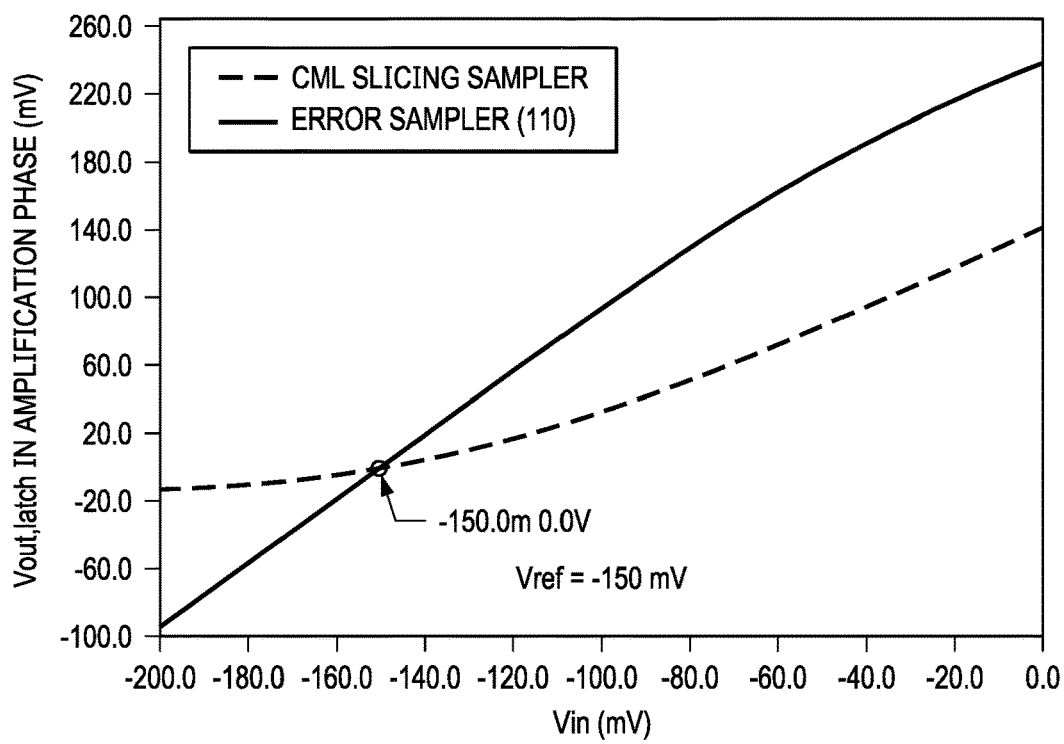
Figure 7:
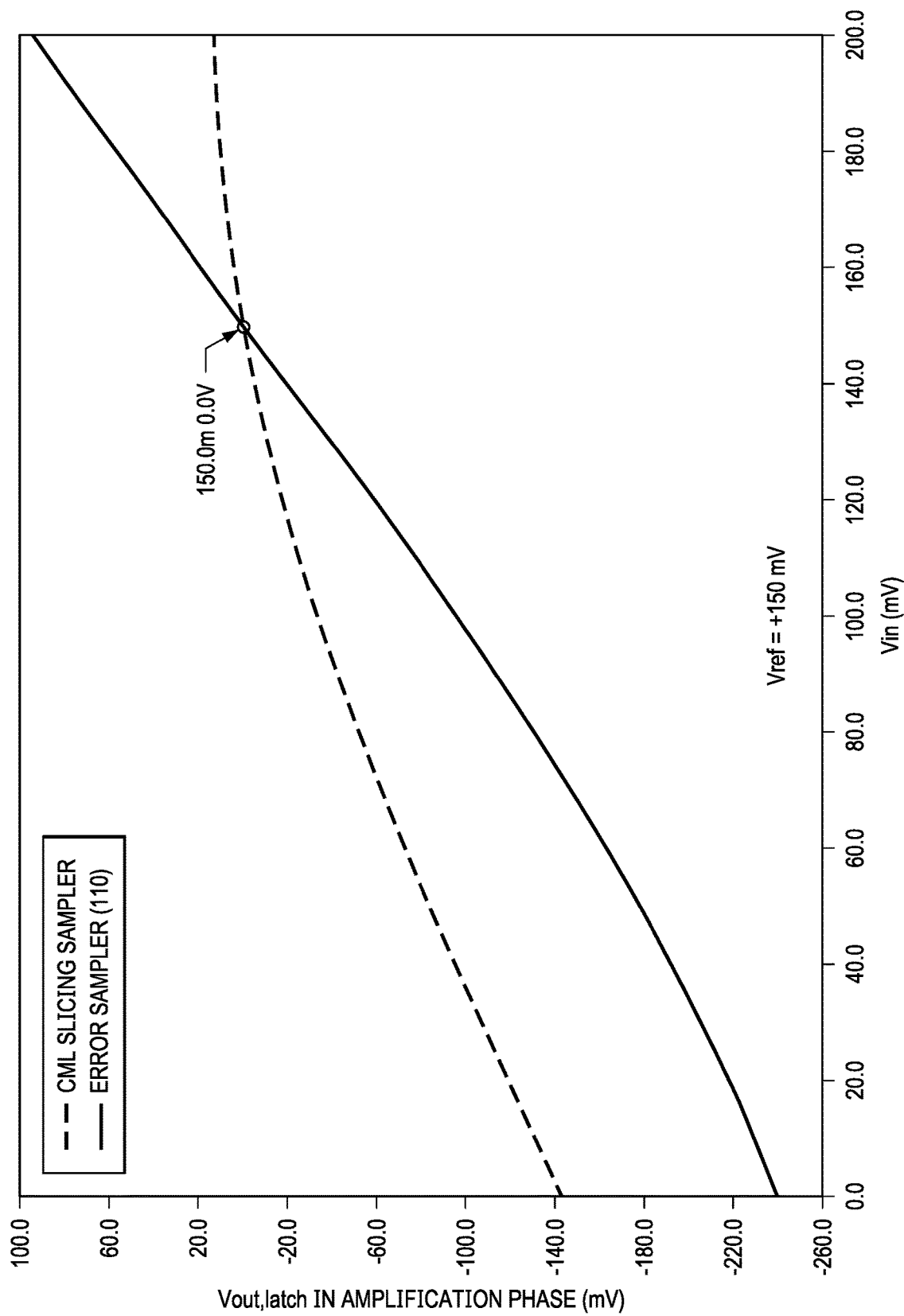

FIGS. 5-7 show graphs comparing gain of the slicer circuit 206 in the error sampler 110 with the slicer gain of a current mode logic (CML) error sampler. In FIGS. 5-7, the x-axis represents the voltage in millivolts (mV) of the input signal Vin at the input terminals 110A and 110B of the error sampler 110, and the y-axis represents the voltage, in mV, of the output of the slicer circuit 206 (i.e., output of the master latch circuit 202 when CK is low (amplification phase)). Values of Vref of 0 volts, −150 millivolts, and 150 millivolts are applied in FIGS. 5, 6, and 7 respectively. The error sampler 110 has a higher small signal gain at Vin=Vref (the trip point of the slicer circuit 206, illustrated as a circle in each gain curve) than the CML error sampler across values of Vref. At large Vref values (+/−150 millivolts), the error sampler 110 retains its gain, while the gain of the CML error sampler drops significantly as it transitions out of linear operation. Unlike the CML error sampler, the amplification gain and sensitivity of the error sampler 110 is independent of Vref.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While particular transistor structures are referred to above, other transistors or device structures may be used instead. For example, other types of transistors (such as metal-oxide-silicon, MOSFET) may be utilized in place of the transistors shown. Additionally, the transistors may be implemented NPN transistors, PNP transistors, pMOSFETs and/or nMOSFETS. The capacitors may be implemented using different device structures (such as metal structures formed over each other to form a parallel plate capacitor) or may be formed on layers (metal or doped semiconductors) closer to or farther from the semiconductor substrate surface.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Modifications are possible in the described embodiments, and other embodiments are possible, within the scope of the claims.

What is claimed is:

1. An equalizer circuit, comprising:
   a decision feedback equalizer (DFE) circuit having a first output and a second output;
   a sign-sign least mean squares (SS-LMS) adaptation circuit having a weight value output coupled to the DFE circuit;
   an error sampler circuit coupled to the DFE circuit and the SS-LMS adaptation circuit, the error sampler circuit comprising a master latch circuit, and the master latch circuit including a slicer circuit configured to:
   generate a first difference signal as a difference of the first output and a first reference signal; and
   generate a second difference signal as a difference of the second output and a second reference signal; and
   a slave latch circuit coupled to the master latch circuit and the SS-LMS adaptation circuit, and configured to:
   generate a third difference signal as a difference of the first difference signal and the second difference signal;
   latch the third difference signal; and
   provide the third difference signal to the SS-LMS adaptation circuit.

2. The equalizer circuit of claim 1, wherein the master latch circuit further comprises a first latch circuit coupled to the slicer circuit, and configured to latch an output of the slicer circuit.

3. The equalizer circuit of claim 2 wherein the slave latch comprises a comparator configured to compare a first output signal and a second output signal of the master latch circuit in the second phase of the clock signal.

4. The equalizer circuit of claim 3 wherein the slave latch further comprises a second latch circuit coupled to the comparator, and configured to latch an output of the comparator in the first phase of the clock signal.

5. The equalizer circuit of claim 1 wherein the slicer circuit is further configured to compare an input voltage to a reference voltage in a first phase of a clock signal.

6. The equalizer circuit of claim 1 wherein the error sample circuit includes a common-mode feedback loop.

7. The equalizer circuit of claim 6 wherein the a common-mode feedback loop includes:
   an amplifier configured to generate an error voltage as a difference of a first common-mode voltage and a second common-mode voltage.

8. The equalizer circuit of claim 7 wherein the a common-mode feedback loop further includes:
   a buffer circuit coupled to a DAC and an amplifier, and configured to:
   buffer output of the DAC;
   adjust the first common-mode voltage based on the error voltage; and
   provide the reference voltage to the slicer circuit.

9. The equalizer circuit of claim 8, wherein the common-mode feedback loop further comprises:
   a first resistor and a second resistor configured to generate the second common-mode voltage; and
   a third resistor and a fourth resistor configured to generate the first common-mode voltage.

10. An equalizer circuit, comprising:
    a decision feedback equalizer (DFE) circuit having a first output and a second output;
    a sign-sign least mean squares (SS-LMS) adaptation circuit having a weight value output coupled to the DFE circuit; and
    an error sampler circuit coupled to the DFE circuit and the SS-LMS adaptation circuit, the error sampler circuit comprising a master latch circuit, and the master latch circuit including a slicer circuit configured to:
    generate a first difference signal as a difference of the first output and a first reference signal;
    generate a second difference signal as a difference of the second output and a second reference signal;
    a reference voltage source wherein the reference voltage source comprises:
    a digital-to-analog converter (DAC) coupled to the SS-LMS adaptation circuit, and configured to generate a reference voltage based on an output of the SS-LMS adaptation circuit;
    a common-mode feedback loop coupled to the DAC, the DFE circuit, and the error sampler circuit, and configured to adjust a first common-mode voltage of the reference voltage based on a second common-mode voltage of the input voltage.

11. The equalizer circuit of claim 10, wherein the common-mode feedback loop comprises:
    an amplifier configured to generate an error voltage as difference of the first common-mode voltage and the second common-mode voltage; and
    a buffer circuit coupled to the DAC and the amplifier, and configured to:
    buffer output of the DAC;
    adjust the first common-mode voltage based on the error voltage; and
    provide the reference voltage to the slicer circuit.

12. The equalizer circuit of claim 10 wherein the slicer circuit is further configured to compare an input voltage to the reference voltage in a first phase of a clock signal.

13. The equalizer circuit of claim 12 wherein the slave latch comprises a comparator configured to compare a first output signal and a second output signal of the master latch circuit in the second phase of the clock signal.

14. The equalizer circuit of claim 13 wherein the slave latch further comprises a second latch circuit coupled to the comparator, and configured to latch an output of the comparator in the first phase of the clock signal.

15. The equalizer circuit of claim 14 wherein the error sample circuit includes a common-mode feedback loop.

16. The equalizer circuit of claim 15 wherein the a common-mode feedback loop includes:
an amplifier configured to generate an error voltage as a difference of a first common-mode voltage and a second common-mode voltage.

* * * * *